(12) United States Patent
Bothra

(10) Patent No.: US 10,469,097 B1
(45) Date of Patent: Nov. 5, 2019

(54) BODY BIAS CIRCUIT FOR CURRENT STEERING DAC SWITCHES

(71) Applicant: NXP USA, INC., Austin, TX (US)

(72) Inventor: Mayank Bothra, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/211,426

(22) Filed: Dec. 6, 2018

(51) Int. Cl.
*H03M 3/00* (2006.01)
*H03F 3/45* (2006.01)

(52) U.S. Cl.
CPC ........ *H03M 3/464* (2013.01); *H03F 3/45188* (2013.01)

(58) Field of Classification Search
CPC ........... H03M 3/00; H03M 3/45; H03M 3/464
USPC .................................. 341/144–148
See application file for complete search history.

(56) References Cited

U.S. PATENT DOCUMENTS

| 4,590,456 | A | | 5/1986 | Burton et al. | |
|---|---|---|---|---|---|
| 5,019,789 | A | * | 5/1991 | Graeme | H03F 1/3217 330/273 |
| 5,381,112 | A | * | 1/1995 | Rybicki | H03F 3/45112 330/253 |
| 6,181,187 | B1 | * | 1/2001 | Daffron | G11B 21/106 327/323 |
| 6,621,432 | B1 | * | 9/2003 | Ganci | H03M 1/0682 341/136 |
| 6,985,010 | B2 | | 1/2006 | Shumarayev et al. | |
| 7,330,049 | B2 | | 2/2008 | Perisetty | |
| 7,495,471 | B2 | | 2/2009 | Perisetty | |
| 8,416,011 | B2 | | 4/2013 | Chokka et al. | |
| 9,160,345 | B1 | * | 10/2015 | Gorecki | H03K 5/135 |
| 2002/0005750 | A1 | | 1/2002 | Kao et al. | |
| 2002/0044076 | A1 | | 4/2002 | Yao et al. | |
| 2005/0200508 | A1 | * | 9/2005 | Hitko | H03M 1/745 341/144 |
| 2008/0001803 | A1 | * | 1/2008 | Yamaji | H03M 3/354 341/155 |
| 2009/0045993 | A1 | * | 2/2009 | Tokumaru | H03M 1/002 341/136 |
| 2009/0174587 | A1 | | 7/2009 | Ogawa et al. | |
| 2016/0128146 | A1 | * | 5/2016 | Wu | H05B 33/0827 315/291 |
| 2016/0161533 | A1 | * | 6/2016 | Simon | G01R 19/1659 324/103 R |
| 2017/0047100 | A1 | | 2/2017 | Clark et al. | |
| 2018/0122291 | A1 | * | 5/2018 | Kim | G09G 3/2092 |
| 2019/0020320 | A1 | * | 1/2019 | Nallani | H03F 3/45179 |

* cited by examiner

*Primary Examiner* — Lam T Mai

(57) ABSTRACT

An apparatus includes a digital-to-analog converter (DAC) and an independently controlled biasing circuit coupled to the DAC. The DAC includes at least a first transistor and a second transistor, where the first and second transistors are configured to provide output signals for the DAC. The biasing circuit includes a third transistor having a body coupled to the third transistor source and this source is coupled to a first transistor body and to a second transistor body of the first and second transistors of the DAC. A current loop is coupled to the source and the drain of the transistor of the biasing circuit that maintains a substantially same value of current in the biasing circuit as in the DAC.

20 Claims, 3 Drawing Sheets

US 10,469,097 B1

BODY BIAS CIRCUIT FOR CURRENT STEERING DAC SWITCHES

FIELD OF THE DISCLOSURE

The present disclosure relates generally to a digital to analog converter (DAC), and specifically to current steering and feedback DACs for applications such as delta sigma modulators.

BACKGROUND

A DAC is part of a feedback loop in a delta sigma modulator. Any non-linearity in the DAC directly degrades the linearity of the delta sigma modulator at low and medium frequencies. Hence, there is a need for highly linear DACs when used in high performance sigma-delta modulators.

The performance of modern integrated circuits is often limited by power consumption considerations. Integrated circuits often use complementary metal-oxide semiconductor (CMOS) transistor technology such as n-channel metal-oxide-semiconductor (NMOS) and p-channel metal-oxide-semiconductor (PMOS) transistors. Typically, NMOS and PMOS integrated circuits have four terminals including a drain, a source, a gate, and a body. The body terminal, which is sometimes referred to as the well or bulk terminal, can be biased to improve transistor performance. For example, a positive bias voltage can be applied to the body of a PMOS transistor and a negative bias voltage can be applied to the body of an NMOS transistor to change the threshold voltage, and therefore the performance, of the respective transistors. A body bias voltage typically should be regulated in some way because an excessive bias voltage can cause current to leak through a P-well or an N-well of a body-biased transistor. A bias voltage can decrease or increase an effective threshold voltage of each transistor, and for increased effective threshold voltage, the bias voltage reduces its leakage current. Any reduction in the leakage current can also reduce power consumption.

A body bias voltage tends to be a small value as in a range of a few hundred millivolts. Larger body bias voltages can have a significant adverse impact on a performance of a device. A general convention is to tie to an NMOS body to ground or to a most negative supply and to tie a PMOS body to a $V_{DD}$, typically the highest voltage available. Increasing the NMOS body bias from ground to anything higher would reduce the threshold voltage, and consequently would cause a slight increase in leakage but the leakage currents would be extremely small until the NMOS body bias is increased to a point where the diode between source and body turns on and that is the point when a leakage current becomes significant.

Generally, body bias voltages can be generated off chip. However, this approach consumes some of the limited number of input-output pins in the integrated circuit. Consequently, to achieve a better design, a body bias voltage can be provided by an on-chip source to make room for other components in a very limited chip area and available power budget.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Described herein are improvements to a feedback digital-to-analog converter (DAC) in a delta sigma analog-to-digital converter (ADC) including improvements in the linearity of the feedback DAC. According to some embodiments, the feedback DAC is a fully differential current steering DAC. To improve the linearity of the feedback DAC, apart from use of an existing cascode current source, resistive degeneration is added to further improve matching, further improve output impedance, and further improve overall linearity. A low output impedance circuit biases a switch body in the current steering DAC and causes the DAC to track changes in a threshold voltage based on process and temperature changes without use of digital control, calibration, or a resistive ladder, and this allows the DAC to track changes for the DAC switches which are biased using that bias voltage.

Figure 1:
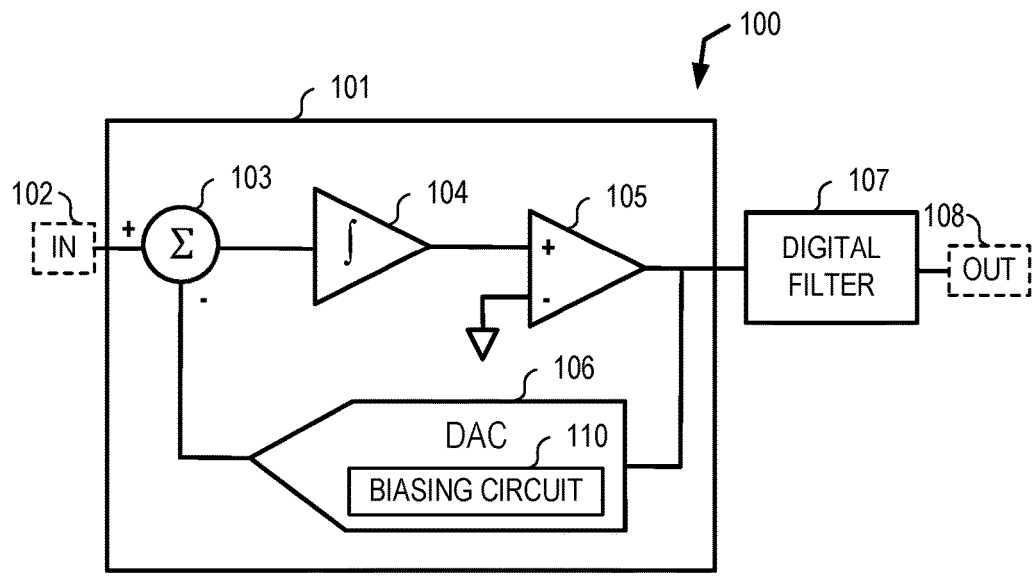
FIG. 1 is a block diagram of an ADC including a delta sigma modulator employing a DAC with a low output impedance circuit for body biasing in accordance with some embodiments.

FIG. 1 is a block diagram of an ADC 100 including a delta sigma modulator 101 in accordance with some embodiments to show an illustrative application of improvements to a DAC or other circuit as further described herein. The delta sigma modulator 101 has various components including a combiner 103, an integrator 104, a comparator 105, and a DAC 106 arranged in a negative-feedback loop with the combiner 103. The integrator 104 is fed a sum of an input signal introduced at an input terminal 102 and a negated output of the DAC 106. In this configuration, an output of the integrator 105 is a ramp signal whose slope is proportional to its input. The integrator output is compared against a comparator reference signal to generate a 0 or 1. A binary output of the comparator 105 is clocked into a digital filter 107 such as a digital decimation filter on every edge of an ADC oversample clock (not illustrated). An output signal is available at an output terminal 108 of the digital filter 107. Each bit represents the direction of the ramp output of the integrator 104 with respect to the comparator reference and, after multiple iterations, a bit stream resembles a quantized value of the input signal. The feedback loop works such that an average output of the DAC 106 matches the input signal. The digital filter 107 averages the bit stream to output an n-bit sample at a desired sample rate. The DAC 106 includes a biasing circuit 110 matched to the components of the DAC 106 as further described herein. The biasing circuit 110 of the DAC 106 illustrates one of many applications for providing a low output impedance circuit to bias a switch body in a companion circuit.

Figure 2:
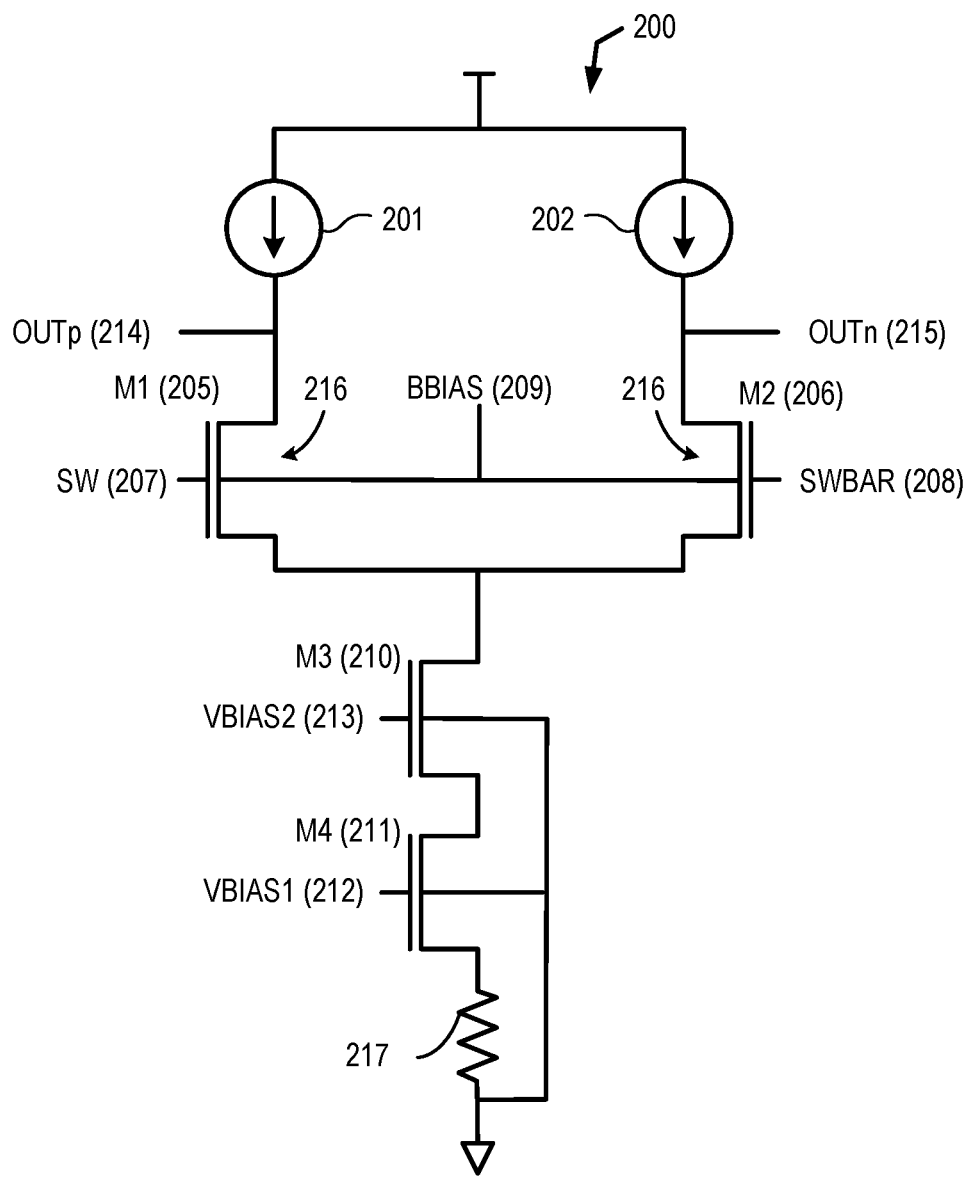
FIG. 2 is a block diagram of a DAC unit cell illustrated in FIG. 1 in accordance with some embodiments.

FIG. 2 is a block diagram of a DAC unit cell 200 in accordance with some embodiments. A first transistor 205 and a second transistor 206 are coupled at their source to a third transistor 210 cascoded in series with a fourth transistor 211 which are labeled M3 and M4, respectively. The fourth transistor 211 is coupled in series with a resistor 217 on one end of the resistor 217 and to ground at the other end of the resistor 217. The present description does not limit the DAC unit cell 200 to such an arrangement. The cascode arrangement offers high gain, high bandwidth, and high stability for the DAC unit cell 200. Further, the cascode arrangement provides a low component count in the two transistors 210, 211 and the single resistor 217. While a fixed number of cascode-connected transistors is shown and represented by the third transistor 210 and the fourth transistor 211, other numbers of components are possible.

At the other end of the DAC unit cell 200, the respective drains of the first transistor 205 and the second transistor 206 are coupled to a respective current source 201, 202, which, in this illustrative embodiment, are tied to a single source. In this embodiment, the DAC unit cell 200 is a current-steering component for the delta sigma modulator 100. The third and the fourth transistors 210 and 211 form a bias load, and the first and second transistors 205 and 206 form a pair of current switches for the first current source 201 and the second current source 202, respectively. The first and second transistors 205 and 206 function as switches for the DAC unit cell 200.

The body (well) regions 216 of the first and second transistors 205 and 206 are electrically connected to a body bias voltage BBIAS 209 that is independently controlled. A magnitude of the body bias voltage BBIAS 209 is less than that of a power source (not illustrated) provided to the DAC unit cell 200 by designing of the body regions 216. Therefore, a body effect of the first and second transistors 205 and 206 is reduced by this arrangement of components. Relatively, a threshold voltage of the first and second transistors 205 and 206 is reduced. A first (positive) output 214 and a second (negative) output 215 are a differential output. However, in other applications or circuits, the outputs 214, 215 could also be configured as a single-ended output.

Third and fourth transistors 210 and 211, and a resistor 217 form a current source, and, depending on a polarity of complementary signals 207, 208, current is steered in a desired direction in the DAC unit cell 200. The third and fourth transistors 210, 211 and the resistor 217 provide a source degeneration resistance. Because of the nature of cascode devices generally, and the degeneration resistor 217, a voltage at the drains of the first transistor 205 and the second transistor 206, as well as at their sources, need to be high enough to keep everything biased properly. If the body bias voltage BBIAS 209 is connected to ground like many NMOS transistors, a threshold voltage becomes high due to a body effect such as at the body regions 216, making a gate-to-source voltage $V_{GS}$ high and reduces a voltage at the source $V_{SS}$ of the first transistor 205 and the second transistor 206 to keep the current source biased properly. A higher $V_{GS}$ makes biasing the current source difficult. A first bias voltage 212 is provided to a gate of the fourth transistor 211, and a second bias voltage 213 is provided to a gate of the third transistor 210 to facilitate operation of the DAC unit cell 200.

Having the source of the first transistor 205 and the source of the second transistor 206 at a high potential can be achieved, for example, by increasing their gate drive voltages or by reducing their threshold voltages. Since the gate drive voltages of the first and second transistors 205, 206 already are at a supply voltage, that voltage cannot be increased, which leaves the option for adjusting the design and operation of the DAC unit cell 200 of reducing the threshold voltage for each of the first and second transistors 205, 206. Their threshold voltages are reduced by lowering or negating a body effect of the first and second transistors 205, 206. Tying the body of the transistors 205, 206 to their source has disadvantages in certain situations because doing so adds body capacitance at the source of the transistors 205, 206. Doing so also increases a sensitivity in actuating the first and second transistors 205, 206 in terms of distortion. In an embodiment having many DAC unit cells (e.g., 4, 8, 16), tying the body of the switch transistors 205, 206 to their source would require all pairs of switches to be in their own respective wells which costs a substantial area in a chip die, and such a large area is often not available for such switches and corresponding unit cells.

In the DAC unit cell 200, one of the two switch transistors 205, 206 is always on because the DAC unit cell 200 is a fully differential circuit. That implies that a potential at a gate of the switch transistors 205, 206 is at a drain supply voltage $V_{DD}$ at substantially all times from a perspective of the switch transistors 205, 206. In the DAC unit cell 200, a body bias reference $V_{DD}-V_{GS}$(on) is generated so that the body 216 of the switch transistors 205, 206 stays at substantially the same potential as the source (e.g., within 0.01%, within 0.5%, within 1.0%, and within 5% of each other), thereby substantially eliminating body effect and diode leakage currents. The diode at issue is formed between diffusion regions (source, drain) and the body 216.

Biasing the body or well of an NMOS transistor to a voltage higher than ground reduces a threshold voltage. However, the biasing voltage cannot be raised too high because doing so can turn on a leakage current at a diode interface between the body (p-side) and the source (n-side) of the switches such as in the first and second switch transistors 205, 206. Instead, a circuit is provided with a low output impedance for a bias voltage to absorb any transient switching currents from the first and second switch transistors 205, 206. Having a low output impedance yields a circuit that achieves an available power budget as a design constraint for this circuit. A common body bias helps keep an area for the components as small as possible for design reasons.

Figure 3:
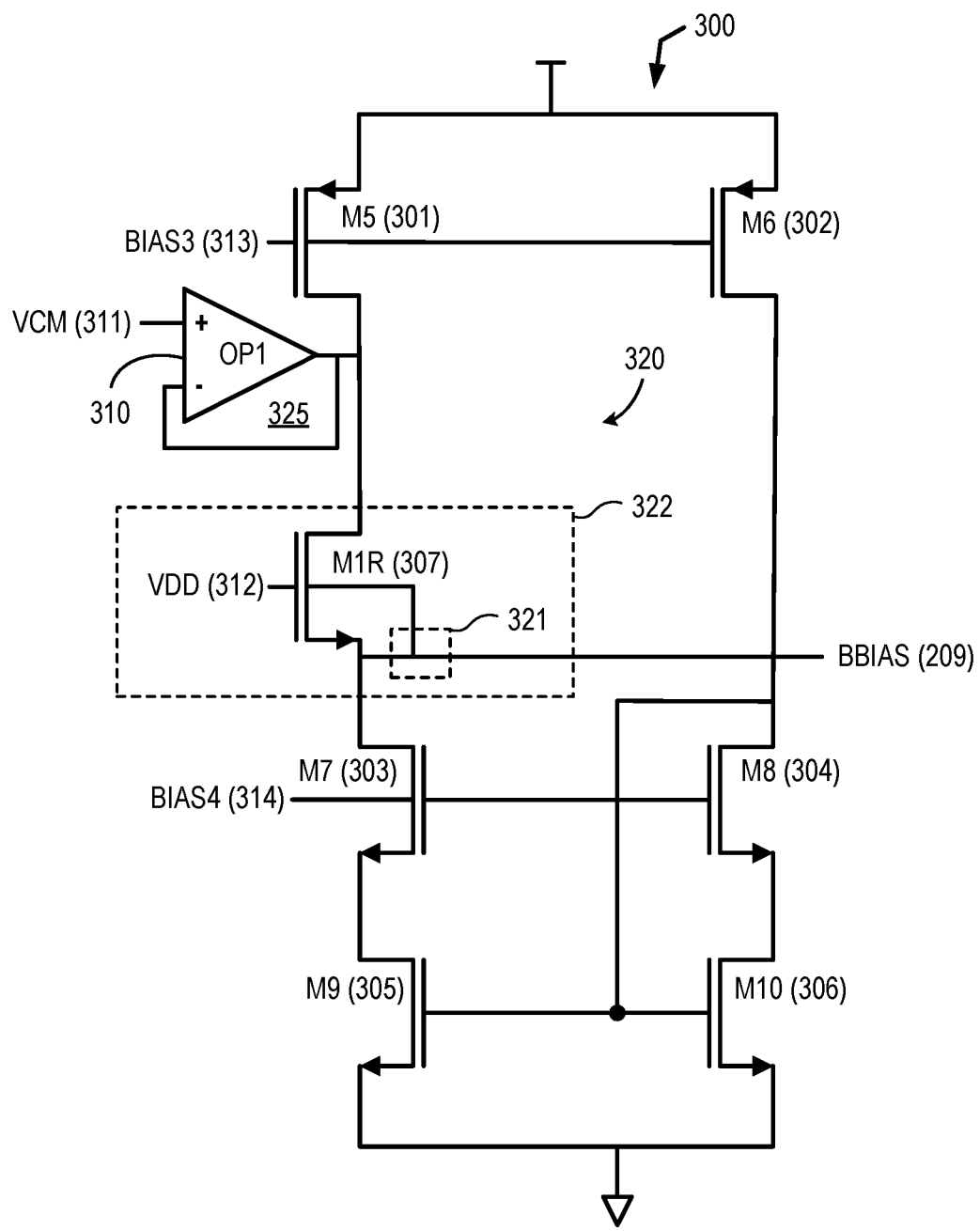
FIG. 3 is a block diagram of a circuit which supplies a body bias voltage to the unit cell of FIG. 2.

FIG. 3 is a block diagram of a bias circuit 300 which supplies the body bias voltage BBIAS 209 to the DAC unit cell 200 of FIG. 2 and the bias circuit is common to an entire DAC that includes one or more DAC unit cells 200. The bias circuit 300 includes a regulated feedback loop that provides a low impedance bias voltage as the body bias voltage BBIAS 209. Together, the DAC unit cell 200 and the bias circuit 300 form a macro DAC unit cell. To generate a reference voltage, a replica circuit such as the bias circuit 300 is paired with another circuit such as the DAC unit cell 200. The bias circuit 300 includes a current loop 320 that maintains substantially the same current as the DAC unit cell 200.

According to some embodiments, the bias circuit 300 has about a same number of transistors as the DAC unit cell 200. For example, the bias circuit 300 includes seven transistors 301-307. In the illustrated embodiment, a first pair of PMOS transistors 301, 302 are at a top of the current loop 320. Two pairs of NMOS transistors 303-306 are positioned at a bottom of the current loop 320. The first six transistors 301-306 form the current loop that maintains approximately a same value of current through a seventh transistor 307 as the DAC unit cell 200 maintains a value of current in the first transistor 205. That is, the first six transistors 301-306 are paired together with a first pair of transistors 301, 302 coupled together at a first end of the current loop 320. The first transistor 301 is coupled in series with the seventh, the third, and the fifth transistors 307, 303, 305 (respectively) along a left or first side of the current loop 320. The second, fourth, and sixth transistors 302, 304, 306 are generally coupled in series along a left or first side of the current loop 320. The fifth and sixth transistors share a connection to ground at a second end of the current loop 320. In the bias circuit 300, gates of the fifth and sixth transistors 305, 306 are coupled to the current loop 320 between the second and fourth transistors 302, 304.

The seventh transistor 307 acts as a replica switch and has its body connected to its source, such as at a first position 321. The seventh transistor 307 also has its own well 322 in the bias circuit 300. A gate of the seventh transistor 307 is coupled to a same drain supply voltage $V_{DD}$ 312 as used to supply the drain supply voltage $V_{DD}$ in the DAC unit cell 200. For the single seventh transistor 307, the area overhead for a single transistor 307 and its corresponding bias circuit 300 is a savings since there is one bias circuit 300 associated with an entire DAC which corresponds to a single NMOS component in its own well for 16 pairs of switches, which makes the bias circuit 300 tiny in comparison to other arrangement of components. In particular, such area overhead is especially a savings when considering that a bias circuit 300 is paired with a set of DAC unit cells 200. For example, a bias circuit 300 would be provided to a set of 16 DAC unit cells 200 in a delta sigma circuit that includes a DAC such as DAC 106.

An opamp 310 is positioned between the first transistor 301 and the seventh transistor 307. A common mode voltage $V_{CM}$ 311 is provided to the opamp 310. A third bias voltage 313 is applied at the gate of the first transistor 301. A body of the first transistor 301 is tied to a gate of the second transistor 302. A fourth bias voltage 314 is applied at the body of the third transistor 303. A gate of the third transistor 303 is tied to a gate of the fourth transistor 304, and a gate of the fifth transistor 305 is tied to a gate of the sixth transistor 306.

Since the drain of the switch transistors 205, 206 in the DAC unit cell 200 is maintained at a constant common mode, a same common mode in the bias circuit 300 is maintained, which ensures a same gate-to-source voltage $V_{GS}$, a same drain-to-source $V_{DS}$, and substantially a same current, making the bias circuit 300 a good replica circuit for the DAC unit cell 200. The bias circuit 300 also includes a low output impedance which is achieved by a combination of an opamp feedback loop 325 and a source-follower configuration. As long as a gain of the opamp 310 is high, the output impedance of the bias is low. The combination of tracking the $V_{GS}$ of the switch transistor (seventh transistor 307) with process and temperature along with a low output impedance makes the bias circuit 300 a good bias generator that prevents body effect and leakage currents for the DAC unit cell 200. In particular, in order to achieve a desired performance, the body bias voltage BBIAS 209 tracks the gate-to-source voltage $V_{GS}$ of switch transistors 205, 206 of DAC unit cell 200 and substantially achieves a same effect as connecting the body to the source of these transistors 205, 206 without an actual connection between the body 216 and source thereof. This arrangement eliminates the transistor body effect and prevents leakage currents into the transistor body 216.

Turning to operation of the bias circuit 300, the common mode voltage $V_{CM}$ is the common mode voltage at the DAC unit cell output of FIG. 2. According to some embodiments, in a delta sigma modulator using a current steering DAC such as DAC unit cell 200, the DAC output voltage is expected to stay constant except for transient switching effects. In other embodiments such as in a standalone current steering DAC, a different reference can be required. The seventh transistor 307 is a replica of the first transistor 205, but with its body tied to its source such as indicated at the first position 321. The opamp 310 as a buffer maintains a similar arrangement on the seventh transistor 307 as on the first and second transistors 205, 206 in the DAC unit cell 200—maintaining the common mode voltage $V_{CM}$ on the seventh transistor 307. 325 comprising OP1 is the buffer that maintains VCM on 307. A buffer maintains a similar arrangement on the switch transistors 205, 206 and is not illustrated.

Use of the current loop 320 instead of using just the first transistor 301, the seventh transistor 307, the third transistor 303 and the sixth transistor 306 (also labeled as M5, M1R, M7 and M10) helps maintain current therein such that a minimum current is drawn from the opamp 310 in a steady state condition. The opamp 310 in the bias circuit 300 only needs to provide current for the transient switching on BBIAS 209 that biases the body of the switch transistors 205, 206. Since BBIAS 209 is taken from the source of the seventh transistor 307, and the drain of the seventh transistor 307 is connected to buffer output, the bias circuit 300 provides a low impedance output. The seventh transistor 307 gate is tied to the drain supply voltage $V_{DD}$ which is true for one of the first and second transistors 205, 206 at any one time since the first and second transistors 205, 206 form a differential pair. With the seventh transistor 307 having the same gate drive voltage, the same drain voltage, and the same current as the first and second transistors 205, 206, there is substantially a virtual short circuit between source and body of the first and second transistors 205, 206 as it is not a physical short circuit.

The bias circuit 300 allows the body bias of switches (the first and second transistors 205, 206) to move with their source voltage through process and temperature variations thereby substantially eliminating body effect and leakage currents. This is an advantage of using the bias circuit 300 as opposed to a fixed reference (e.g., fixed voltage, fixed current). And since the bias circuit 300 already provides a low output impedance, the bias circuit 300 does not require buffering. Further, the bias circuit 300 does not require trimming, calibration, or digital control because the bias circuit facilitates tracking of variations instead of correcting variations after the fact. An absence of buffering helps to achieve power and area design targets while delivering necessary performance such as for an ADC or DAC application.

Figure 4:
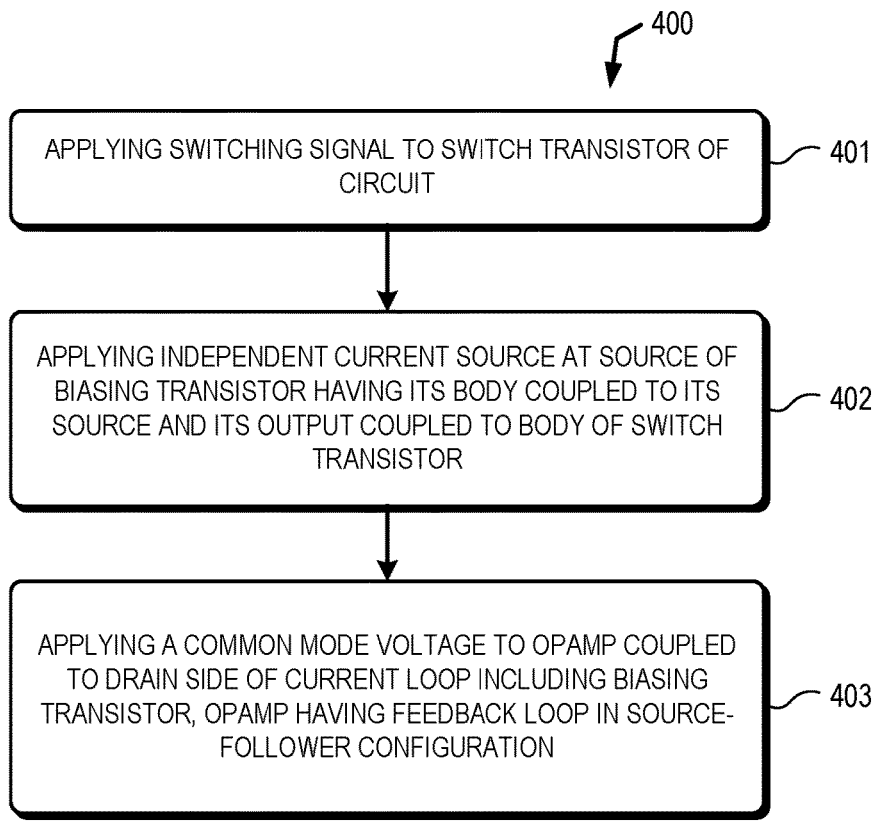
FIG. 4 is a block diagram of a method for providing a body bias voltage to switching transistors of a DAC unit cell in accordance with some embodiments.

FIG. 4 is a block diagram of a method 400 for providing a body bias voltage to switching transistors of a DAC unit cell in accordance with some embodiments. At block 401, a switching signal is applied to one or more switch transistors of a first circuit such as the DAC unit cell 200. At block 402, an independent current source is applied at a source of a biasing transistor where the biasing transistor body is coupled to its source. An output of the biasing transistor is coupled to a body of each switch transistor. At block 403, a common mode voltage is applied to an opamp that is coupled to a drain side of a current loop that includes the biasing transistor. In certain embodiments, the opamp includes a feedback loop in a source-follower configuration. The method 400 is illustrative of coupling the bias circuit 300 with the DAC unit cell 200 and operating the same together provides a low output impedance and prevents a body effect and leakage currents in the switch transistors 207, 208 in the DAC unit cell 200.

Broadly, according to some implementations, a method is provided for a low impedance body bias voltage where the method includes applying a digital switching signal to a switch transistor of a DAC, the switch transistor having a transistor body, and applying a current source at a source of a biasing transistor. The current source is common to the switch transistor and the biasing transistor. The biasing transistor forms part of a current loop tied to a same potential as the switch transistor. A body of the biasing transistor is coupled to its source, and an output of the biasing transistor is coupled to the transistor body of the switch transistor which causes the transistor body of the switch transistor to remain substantially at a same potential as its source.

The configurations illustrated in FIGS. 1-4 are some of many possible configurations for providing a matching bias circuit to other circuits and illustrative methods for providing a body bias voltage to switch transistors. The techniques described herein are applicable to a variety of configurations of components and in a variety of applications. Generally, a bias circuit provides a bias voltage to a substrate of a metal oxide semiconductor (MOS) transistor or other component. The body effect of the component is overcome by providing a low impedance body bias voltage and also prevents substrate leakage currents by using a replica transistor so that the body bias reference voltage accurately tracks variations due to process and temperature variations. Traditional approaches either tie a bias voltage to a supply voltage, which can lead to limited performance, or implements a low impedance reference to bias the body. Having a fixed reference requires enough supply headroom for a high reference and enough safety margin between bias and source voltages to prevent substrate leakage currents due to process and temperature variation in the threshold voltage. The bias circuit 300 overcomes both limitations.

The described techniques apply to an apparatus that includes a DAC and a biasing circuit coupled to the DAC. The DAC includes a first transistor having a first transistor body and a second transistor having a second transistor body. The first and second transistors are configured to provide output signals for the DAC. A third transistor has a source, a drain, and a transistor body where the transistor body is coupled to its source, and the third transistor has its source coupled to the first transistor body of the first transistor and to the second transistor body of the second transistor of the DAC. A current loop is coupled to the drain of the third transistor that maintains a substantially same value of current in the biasing circuit as in the DAC. Optionally, a gate of the third transistor of the biasing circuit is configured to receive a drain supply voltage that is independently controlled relative to the current loop. In some embodiments, the biasing circuit includes an operational amplifier having its output coupled to the drain of the third transistor. The operational amplifier can include a feedback loop in a source-follower configuration. An input of the operational amplifier can be configured to couple to a same common mode voltage source applied to the DAC. The DAC can be a current-steering DAC of a delta sigma modulator circuit. In some embodiments, the DAC is one DAC of an array of DACs or one of a plurality of DACs, and the independently controlled biasing circuit is one biasing circuit of a plurality of biasing circuits matched one to one with respective DACs. In some circuit designs, the transistor body of the third transistor of the biasing circuit is formed in an electrically isolated well region in the biasing circuit and the third transistor is a replica of either the first transistor or the second transistor.

The described techniques also apply to a biasing circuit macro unit cell. For example, a DAC unit cell has at least a first transistor as a current switch, a cascode transistor, and a resistor coupled to the cascode transistor. A biasing circuit is coupled to the DAC unit cell where the biasing circuit includes a second transistor having a source, a drain, and a transistor body, and where the transistor body is coupled to its source, and the second transistor has its source coupled to a body of the first transistor of the DAC unit cell. Optionally, the biasing circuit includes a third transistor coupled to the second transistor where a terminal of the third transistor is biased with a bias voltage from an external voltage source, and a gate of the third transistor of the biasing circuit is configured to receive a drain supply voltage supplied independently of a voltage supplied to the DAC unit cell. In some embodiments, an operational amplifier has its output coupled to the drain of the second transistor and the operational amplifier includes a feedback loop in a source-follower configuration. Further, an input of the operational amplifier can be configured to couple to a same common mode voltage source applied to the DAC unit cell. The DAC unit cell can be coupled to an analog-to-digital converter of a delta sigma modulator circuit. The second transistor of the biasing circuit can be an NMOS-type transistor. The biasing circuit can include a pair of NMOS transistors where the pair of NMOS transistors and the second transistor form a current loop. The second transistor can include an NMOS transistor element, a PMOS transistor element, or a CMOS transistor element.

Note that not all of the activities or elements described above in the general description are required, that a portion of a specific activity, component, or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus, comprising:
   a digital-to-analog converter (DAC) including:
      a first transistor having a first transistor body; and
      a second transistor having a second transistor body, the first and second transistors configured to provide output signals for the DAC; and
   a biasing circuit coupled to the DAC, comprising:
      a third transistor having a source, a drain, and a transistor body, the transistor body coupled to its source, the third transistor having its source coupled to the first transistor body of the first transistor and to the second transistor body of the second transistor of the DAC; and a current loop coupled to the drain of the third transistor that maintains a substantially same value of current in the biasing circuit as in the DAC.

2. The apparatus of claim 1, wherein a gate of the third transistor of the biasing circuit is configured to receive a drain supply voltage that is independently controlled relative to the current loop.

3. The apparatus of claim 1, wherein the biasing circuit further comprises an operational amplifier having its output coupled to the drain of the third transistor.

4. The apparatus of claim 3, wherein the operational amplifier includes a feedback loop in a source-follower configuration.

5. The apparatus of claim 3, wherein an input of the operational amplifier is configured to couple to a same common mode voltage source applied to the DAC.

6. The apparatus of claim 1, wherein the DAC is a current-steering DAC of a delta sigma modulator circuit.

7. The apparatus according to claim 6, wherein the DAC is one DAC of an array of a plurality of DACs, and wherein the biasing circuit is independently controlled and one biasing circuit of a plurality of biasing circuits matched one to one with respective DACs.

8. The apparatus of claim 1, wherein the transistor body of the third transistor of the biasing circuit is formed in an electrically isolated well region in the biasing circuit.

9. The apparatus of claim 1, wherein the third transistor is a replica of either the first transistor or the second transistor.

10. A digital-to-analog converter (DAC) and biasing circuit macro unit cell, comprising:

a digital-to-analog converter (DAC) unit cell having at least a first transistor as a current switch, a cascode transistor, and a resistor coupled to the cascode transistor; and a biasing circuit coupled to the DAC unit cell, the biasing circuit comprising:

a second transistor having a source, a drain, and a transistor body, the transistor body coupled to its source, the second transistor having its source coupled to a body of the first transistor of the DAC unit cell.

11. The macro unit cell of claim 10, wherein the biasing circuit further comprises:

a third transistor coupled to the second transistor, a terminal of the third transistor biased with a bias voltage from an external voltage source, and wherein a gate of the second transistor of the biasing circuit is configured to receive a drain supply voltage supplied independently of a voltage supplied to the DAC unit cell.

12. The macro unit cell of claim 10, wherein the biasing circuit further comprises an operational amplifier having its output coupled to the drain of the second transistor.

13. The macro unit cell of claim 12, wherein the operational amplifier includes a feedback loop in a source-follower configuration.

14. The macro unit cell of claim 12, wherein an input of the operational amplifier is configured to couple to a same common mode voltage source applied to the DAC unit cell.

15. The macro unit cell of claim 10, wherein the DAC unit cell is coupled to an analog-to-digital converter of a delta sigma modulator circuit.

16. The macro unit cell of claim 10, wherein the second transistor of the biasing circuit is formed in an electrically isolated well in the biasing circuit.

17. The macro unit cell of claim 10, wherein the second transistor of the biasing circuit is an NMOS-type transistor.

18. The macro unit cell of claim 10, wherein the biasing circuit further comprises:

a pair of NMOS transistors, the pair of NMOS transistors and the second transistor forming a current loop.

19. The macro unit cell of claim 18, wherein the second transistor comprises an NMOS transistor element, a PMOS transistor element, or a CMOS transistor element.

20. A method for providing a low impedance body bias voltage, the method comprising:

applying a digital switching signal to a switch transistor of a digital-to-analog converter (DAC), the switch transistor having a transistor body; and applying a current source at a source of a biasing transistor, the current source common to the switch transistor and the biasing transistor, the biasing transistor forming part of a current loop tied to a same potential as the switch transistor, wherein a body of the biasing transistor is coupled to its source, and wherein an output of the biasing transistor is coupled to the transistor body of the switch transistor causing the transistor body of the switch transistor to remain substantially at a same potential as its source.

* * * * *